US 10,854,448 B2

United States Patent
Takahashi et al.

(10) Patent No.: US 10,854,448 B2
(45) Date of Patent: Dec. 1, 2020

(54) PLASMA GENERATING DEVICE, PLASMA SPUTTERING DEVICE, AND PLASMA SPUTTERING METHOD

(71) Applicant: TOHOKU UNIVERSITY, Sendai (JP)

(72) Inventors: Kazunori Takahashi, Miyagi (JP); Jun Fukushima, Miyagi (JP); Akira Ando, Miyagi (JP); Yasumasa Sasaki, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/482,400

(22) PCT Filed: Jan. 30, 2018

(86) PCT No.: PCT/JP2018/002876
§ 371 (c)(1),
(2) Date: Jul. 31, 2019

(87) PCT Pub. No.: WO2018/143164
PCT Pub. Date: Aug. 9, 2018

(65) Prior Publication Data
US 2019/0362969 A1    Nov. 28, 2019

(30) Foreign Application Priority Data

Jan. 31, 2017 (JP) ................ 2017-015548

(51) Int. Cl.
*H01L 21/00* (2006.01)
*H01L 21/02* (2006.01)
(Continued)

(52) U.S. Cl.
CPC ........ *H01L 21/02631* (2013.01); *C23C 14/35* (2013.01); *H05H 1/46* (2013.01)

(58) Field of Classification Search
CPC ............................................... H01L 21/02631
See application file for complete search history.

(56) References Cited

U.S. PATENT DOCUMENTS

| 5,795,429 A | 8/1998 | Ishii et al. |
| 6,111,512 A | 8/2000 | Sugimoto et al. |

(Continued)

FOREIGN PATENT DOCUMENTS

| JP | 03-138363 A | 6/1991 |
| JP | 10-253518 A | 9/1998 |

(Continued)

OTHER PUBLICATIONS

Kazunori Takahashi et al., "Axial Momentum Lost to a Lateral Wall of a Helicon Plasma Source", Physical Review Letters, May 2015, pp. 195001-1-195001-5, PRL 114, 195001.

(Continued)

*Primary Examiner* — Caridad Everhart
*Assistant Examiner* — Ankush K Singal
(74) *Attorney, Agent, or Firm* — Sughrue Mion, PLLC

(57) ABSTRACT

A plasma sputtering device including one or a plurality of plasma generating devices each including an insulating tube having an expanding inner diameter and having a gas injection port formed in an end portion or a side portion thereof, a first electromagnet or a permanent magnet group which can apply a static magnetic field, and a high frequency antenna; a second electromagnet which is disposed in a region downstream of the plasma generating device(s) and which can form a curved magnetic force line structure; a target mechanism which includes a permanent magnet embedded therein and a cooling mechanism and which can apply a DC or high frequency voltage; a substrate stage facing the target mechanism; a second permanent magnet group around the substrate stage; and a heat insulating mechanism between a target material and the target mechanism.

16 Claims, 8 Drawing Sheets

(51) Int. Cl.
 *C23C 14/35* (2006.01)
 *H05H 1/46* (2006.01)

(56) References Cited

U.S. PATENT DOCUMENTS

| | | | |
|---|---|---|---|
| 8,524,102 B2 * | 9/2013 | Yamazaki | H01L 21/31138 216/67 |
| 2002/0185226 A1 | 12/2002 | Lea et al. | |
| 2006/0213865 A1 * | 9/2006 | Honda | H01L 21/31138 216/67 |
| 2010/0059369 A1 * | 3/2010 | Shiina | H01J 37/3178 204/298.41 |

FOREIGN PATENT DOCUMENTS

| | | |
|---|---|---|
| JP | 11-354511 A | 12/1999 |
| JP | 3224443 B2 | 10/2001 |
| JP | 2002-294436 A | 10/2002 |
| JP | 2002-329669 A | 11/2002 |
| JP | 2003-289070 A | 10/2003 |
| JP | 2004-193083 A | 7/2004 |
| JP | 2004-523890 A | 8/2004 |
| JP | 2005-183062 A | 7/2005 |
| JP | 2013-129874 A | 7/2013 |
| JP | 2015-135883 A | 7/2015 |
| JP | 2016-042496 A | 3/2016 |
| WO | 2014/097577 A1 | 6/2014 |

OTHER PUBLICATIONS

Kazunori Takahashi et al., "Neutral-depletion-induced axially asymmetric density in a helicon source and imparted thrust", Applied Physics Letters, Feb. 18, 2016, 108, 074103, 5 pages.
Dmitrii V. Sidelev et al., "High-rate magnetron sputtering with hot target", Surface & Coatings Technology, 2016, pp. 168-173, 308.
International Search Report for PCT/JP2018/002876, dated Mar. 20, 2018.

* cited by examiner

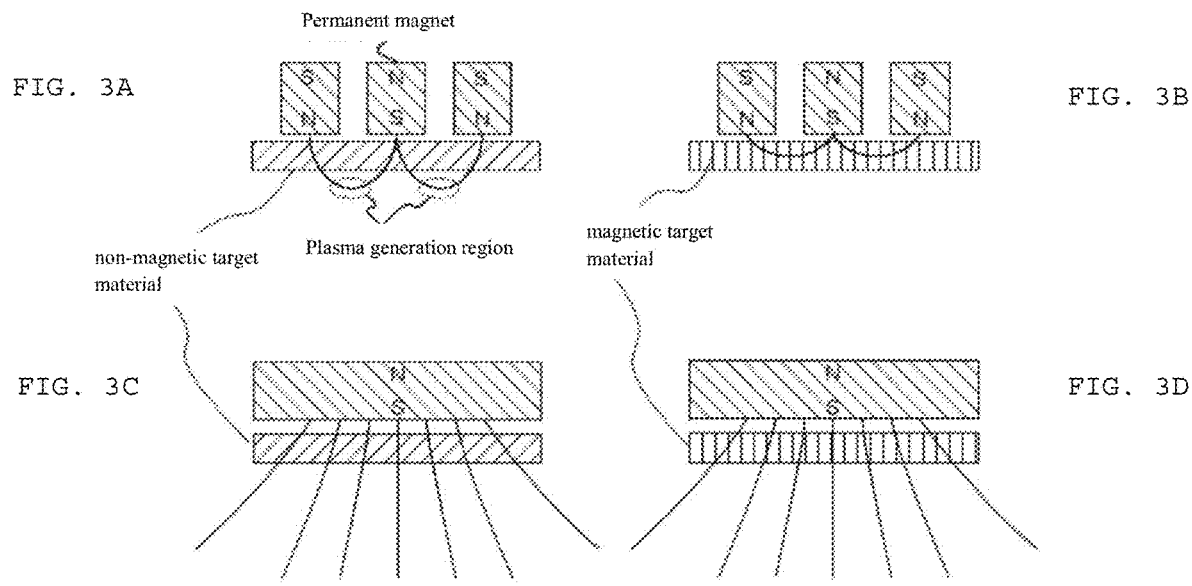
FIG. 3A  FIG. 3B
FIG. 3C  FIG. 3D
FIG. 4
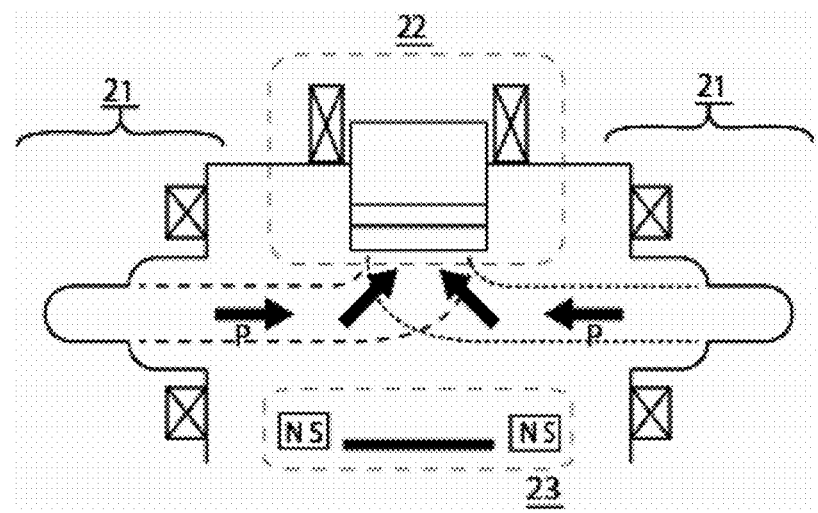

PLASMA GENERATING DEVICE, PLASMA SPUTTERING DEVICE, AND PLASMA SPUTTERING METHOD

CROSS REFERENCE TO RELATED APPLICATIONS

This application is a National Stage of International Application No. PCT/JP2018/002876 filed Jan. 30, 2018, claiming priority based on Japanese Patent Application No. 2017-015548 filed Jan. 31, 2017.

TECHNICAL FIELD

The present invention relates to a plasma generating device, a plasma sputtering device, and a plasma sputtering method. More specifically, the present invention relates to a plasma sputtering device which includes a plasma generating device having a high frequency electric power supply device, a plasma control device having a static magnetic field application mechanism, a mechanism for heating a target by plasma, and a substrate stage facing a target mechanism, and to a plasma sputtering method performed through use of the plasma sputtering device.

BACKGROUND ART

In the field of manufacture of semiconductor devices, magnetic recording devices, etc., a sputtering apparatus is widely used as a thin film deposition device. In the sputtering apparatus, ions in the plasma are taken into a target member, and particles scattered as a result of ion bombardment are deposited on the surface of a substrate. Since the amount (thickness) of the target member sputtered per unit time is proportional to the ion current taken into the target; i.e., the ion density on the surface of the target member, high density plasma must be generated near the target in order to realize a high-speed sputtering device which secures productivity on an industrial scale.

With an increasing degree of fineness of devices or an increasing demand for higher quality of thin film crystals, ion damage to the substrate has become a significant problem. In a widely used magnetron sputtering method, plasma is formed directly between a target member and a substrate, avoidance of ion damage is difficult, and this problem becomes remarkable when high density plasma is generated. Also, since discharge for plasma generation and attraction of ions are performed simultaneously through use of a common power supply, the amount of ions flowing into the target member and their energy cannot be controlled independently of each other. Also, in the magnetron sputtering method, plasma is confined by leakage flux presenting on the target surface. Therefore, it is difficult to use the magnetron sputtering method for a magnetic target.

A sputtering device which can control the generation of plasma and the attraction of ions independently of each other is disclosed (Japanese Patent Application Laid-Open (kokai) No. 2003-289070; Patent Document 1). In the disclosed sputtering device, a substrate and a target are inserted into an inductively coupled plasma source or a helicon wave plasma source. In this scheme, since the substrate is exposed directly to plasma, avoidance of ion damage to the substrate is difficult. Patent Document 1 does not state any measure for avoiding such ion damage.

For example, a helicon wave excited sputtering device is disclosed as a damage-free sputtering device (Japanese Patent Application Laid-Open (kokai) No. 2002-329669; Patent Document 2). In general, in such a scheme in which a plasma generation section and an ion attraction section are prepared separately, it is difficult to employ an arrangement in which a target and a substrate face each other and which is considered to yield the highest sputtering efficiency.

In the case where plasma flows into a substrate, the energy of ions flowing into the substrate is determined by a potential drop of a sheath structure generated in front of the substrate. As a result, conceivably, high-energy ions flow into the substrate and damage the substrate. Since this potential drop is determined by electron temperature, the electron temperature at the surface of the substrate must be lowered.

There has been disclosed a method of lowering the electron temperature by employing a magnetic filter which applies magnetic field lines in a direction perpendicular to the flow direction of plasma (Japanese Patent Application Laid-Open (kokai) No. 2005-183062; Patent Document 3). However, Patent Document 3 does not state about ion energy flowing into the substrate in the sputtering device.

In a helicon wave excited plasma generation device and an inductively coupled plasma generating device, in general, plasma is generated within a cylindrical insulating tube (for example, Patent Document 1 and Japanese Patent No. 3224443; Patent Document 4). When high density plasma is generated inside such a cylindrical insulating tube by a high frequency electromagnetic field, it is difficult to suppress of loss of plasma into the inner wall of the insulating tube and difficult to maintain the high density plasma in a region downstream of the plasma source. Moreover, it has been reported that, when the density of plasma and electric power are increased, due to the so-called neutral depletion phenomenon, the distribution of plasma changes and loss becomes remarkable, so that the plasma density in the region downstream of the plasma source decreases (Non-patent Documents 1 and 2).

A method for maintaining the high density plasma in the region downstream of the plasma source has been disclosed (Japanese Patent Application Laid-Open (kokai) No. 2015-135883; Patent Document 5). In the disclosed method, a permanent magnet is disposed on the back side of the target so as to form a converging magnetic field, thereby converging plasma.

Also, it is apparent that in the plasma sputtering method, the rate of formation of thin film on the substrate and the characteristic of the formed thin film change with the temperature of the target. Therefore, the surface temperature of the target must be controlled over a wide range. Further, in the case where a vapor deposition phenomenon occurs as a result of an increase in the temperature of the target material, the speed of film formation can be increased (Non-patent Document 3), and in the case where the target material is a material which sublimes as a result of temperature rise, the sublimation phenomenon (sublimation of the target material from the solid target) further increases the film formation speed.

In order to secure the productivity of thin-film devices by plasma sputtering, there has been demand to develop a plasma sputtering device which can perform, at high speed, a series of processes on a wafer having a relatively large diameter.

It has been known that the distribution of the density of formed plasma changes with the degree of ionization of a neutral gas (Non-patent Documents 1 and 2). Therefore, in a sputtering scheme in which a reactive gas is used, conceivably, the distribution of plasma changes greatly depending on the species of gas to be introduced. Therefore, for example, in the sputtering devices described in Patent Documents 1 and 2, the design of the plasma generation section must be adjusted in accordance with the species of gas to be introduced. Therefore, these sputtering devices have room for improvement from the viewpoint of productivity and versatility of the sputtering devices.

The plasma sputtering device and the plasma generation scheme described in Patent Documents 1 and 4 have a problem of failing to maintain high density plasma in a region downstream of the plasma source. Therefore, in the plasma sputtering device in which a plasma generation section and a sputtering section are provided separately in order to suppress damage to the substrate, realization of high-speed sputtering is difficult.

In the plasma sputtering device of Patent Document 2, since plasma is conveyed to a target region along straight lines of magnetic force, a limitation is imposed on the substrate disposition angle, and it is difficult to dispose the substrate and the target member to face each other, thereby yielding the highest sputtering efficiency.

In the plasma sputtering devices of Patent Documents 2, 4, and 5, since it is difficult to avoid the inflow of high-energy ions due to formation of a sheath structure in front of the substrate, the ion damage to the substrate must be suppressed.

Since the plasma sputtering devices of Patent Documents 1, 2, 4, and 5 do not have a mechanism of raising the temperature of the target member, these devices cannot cope with optimal processes suitable for various types of target members.

The plasma sputtering devices of Patent Documents 1, 2, 4, and 5 have only a single plasma source. In addition, adjustment of the distribution of plasma density for uniform formation of film on a large diameter substrate in consideration of productivity is performed only through design of the plasma source. Therefore, these devices encounter difficulty in flexibly coping with a change in the distribution caused by the species of the process gas used.

PRIOR ART DOCUMENTS

Patent Documents

Patent Document 1: Japanese Patent Application Laid-Open (kokai) No. 2003-289070
Patent Document 2: Japanese Patent Application Laid-Open (kokai) No. 2002-329669
Patent Document 3: Japanese Patent Application Laid-Open (kokai) No. 2005-183062
Patent Document 4: Japanese Patent No. 3224443
Patent Document 5: Japanese Patent Application Laid-Open (kokai) No. 2015-135883

Non-Patent Documents

Non-patent Document 1: Physical Review Letters, 114, 195001 (2015)
Non-patent Document 2: Applied Physics Letters, 108, 074103 (2016)
Non-patent Document 3: Surface and Coating Technology, 308, 168 (2016)

SUMMARY OF THE INVENTION

Problem to be Solved by the Invention

In light of the above circumstances, one object of the present invention is to provide a high-speed sputtering device which does not damage substrates. Another object of the present invention is to provide a high-speed sputtering device which also functions as a mechanism for raising the temperature of a target member. Still another object of the present invention is to provide a high-speed sputtering device which can uniformly form a film on a large-diameter substrate. Still another object of the present invention is to provide a sputtering device which can form a high quality crystalline thin film whose ion damage is small. Still another object of the present invention is to provide a sputtering device which can form a thin film through use of a magnetic target.

Means for Solving the Problem

In order to achieve the above-described object, the present invention provides plasma sputtering methods described in the following sections [1] to [5], plasma sputtering devices described in the following sections [6] to [15], and a plasma generating device described in the following section [16].

[1] A plasma sputtering method characterized in that one or a plurality of plasmas are generated by one or a plurality of plasma generating devices each having an insulating tube having an expanding inner diameter and having a gas injection port formed in an end portion or a side portion of the insulating tube, a first electromagnet or a permanent magnet member group which can apply a static magnetic field, and a high frequency antenna; and the plasma or plasmas are forced to flow into a vacuum chamber and reach a local region near a target by a curved magnetic field line structure formed by a second electromagnet disposed in a downstream region, whereby ions are taken into the target.

[2] The plasma sputtering method described in the above section [1], wherein the temperature of the target is raised by ion energy which flows into a target surface when the ions are taken into the target.

[3] The plasma sputtering method described in the above section [1] or [2], wherein film formation is performed while entry of ion incident energy to a substrate stage facing a target mechanism is suppressed by a magnetic field line structure formed by a permanent magnet disposed near the substrate stage.

[4] The plasma sputtering method described in any of the above sections [1] to [3], wherein a substrate is disposed at a position at which the substrate does not interfere with the magnetic field line extending from the plasma generating device and curved toward the target or a position further away from the target than that position, whereby plasma damage to the substrate is suppressed.

[5] The plasma sputtering method described in any of the above sections [1] to [4], wherein the target has an area equal to or larger than that of the plasma generating device so as to prevent ion irradiation to members other than the target material.

[6] A plasma sputtering device characterized by comprising:
one or a plurality of plasma generating devices each having an insulating tube having an expanding inner diameter and having a gas injection port formed in an end portion or a side portion of the insulating tube, a first electromagnet or a permanent magnet member group which can apply a static magnetic field, and a high frequency antenna;

a second electromagnet which is disposed in a region downstream of the plasma generating device and which forms a curved magnetic field line structure;

a target mechanism; and a substrate stage facing the target mechanism.

[7] The plasma sputtering device described in the above section [6], further comprising a permanent magnet which is embedded in the target mechanism and which can apply a DC or high frequency voltage.

[8] The plasma sputtering device described in the above section [6] or [7], wherein the target mechanism includes a cooling mechanism.

[9] The plasma sputtering device described in any one of the above sections [6] to [8], further comprising a heat insulating mechanism between a target material and the target mechanism.

[10] The plasma sputtering device described in any one of the above sections [6] to [9], further comprising a second permanent magnet member group disposed around the substrate stage.

[11] The plasma sputtering device described in any one of the above sections [6] to [10], wherein a substrate is disposed at a position at which the substrate does not interfere with the curved magnetic field line structure formed by the first electromagnet and the second electromagnet or the target mechanism including a permanent magnet embedded therein, or the substrate is disposed at a position further away from the target than that position.

[12] The plasma sputtering device described in any one of the above sections [6] to [11], wherein the target has an area equal to or larger than that of the plasma generating device so as to prevent ion irradiation to members other than the target.

[13]

A plasma sputtering device described in any one of the above sections [6] to [12], wherein the first electromagnet or a first permanent magnet member group can apply a static magnetic field extending in the longitudinal direction of the insulating tube;

which plasma sputtering device comprising a high frequency electric power supply device whose frequency band is 2 MHz to 100 MHz, and an inductively coupled high frequency antenna disposed around the insulating tube.

[14] The plasma sputtering device described in any one of the above sections [10] to [13], wherein the second permanent magnet member group around the substrate stage is a permanent magnet member group which can apply a static magnetic field lines parallel to a surface of the substrate.

[15] The plasma sputtering device described in any one of the above sections [6] to [14], further comprising means for changing excitation current of the second electromagnet as a function of time.

[16] A plasma generating device characterized by comprising: an insulating tube having an expanding inner diameter and having a gas injection port formed in an end portion or a side portion of the insulating tube; a first electromagnet or a first permanent magnet member group which can apply a static magnetic field in the insulating tube; a high frequency electric power supply device whose frequency band is 2 MHz to 100 MHz; and an inductively coupled high frequency antenna disposed around the insulating tube.

Effects of the Invention

The plasma sputtering methods of the present invention, the plasma sputtering devices of the present invention, and the plasma generating device of the present invention yield the following effects. High density plasma can be generated in the region downstream of the plasma source, and the efficiency of plasma irradiation to the target member can be improved by the curved magnetic field. Namely, since the target member and the substrate are disposed to face each other in the region downstream of the plasma generation section, a thin film can be formed at high speed. Also, since the flux and the energy of ions flowing into the substrate can be suppressed by the curved magnetic field and the substrate stage mechanism having a permanent magnet group, it is possible to form a thin film at high speed or form a high-quality crystalline thin film while suppressing the damage to the substrate. Also, since the temperature of the surface of the target member can be raised by ion incident energy, it is possible to realize optimal processes suitable for various types of target members and to perform high-speed film formation through vaporization and sublimation of target materials, which phenomena occur simultaneously (in a superimposed manner).

Moreover, since one or a plurality of plasma generating devices are attached to the vacuum chamber, a film can be formed on a substrate having a large diameter through use of a target having a large diameter. Also, since the distribution of the time average amount of ions taken into the target can be controlled by changing the excitation current of the second electromagnet at high speed, formation of a thin film which has a large diameter and is uniform can be realized.

BRIEF DESCRIPTION OF THE DRAWINGS

FIGS. 3A through 3D are schematic views each showing a magnetic field line structure formed when a non-magnetic or magnetic target is used in a plasma sputtering method and the plasma sputtering device of the present invention, wherein FIG. 3A shows a magnetic field line structure formed when a non-magnetic material is used as a target member in the conventional magnetron sputtering method, FIG. 3B shows a magnetic force line structure formed when a magnetic material is used as a target member in the conventional magnetron sputtering method, FIG. 3C shows a magnetic field line structure formed when a non-magnetic material is used as a target member in the present invention, and FIG. 3D shows a magnetic field line structure formed when a magnetic material is used as a target member in the present invention.

FIG. 4 is a schematic view showing an example of a plasma sputtering device in which a plurality of plasma generating devices are disposed in a vacuum chamber.

MODES FOR CARRYING OUT THE INVENTION

Embodiments of the present invention will now be described with reference to the attached drawings.
<Basic Device Structure>

Figure 2:
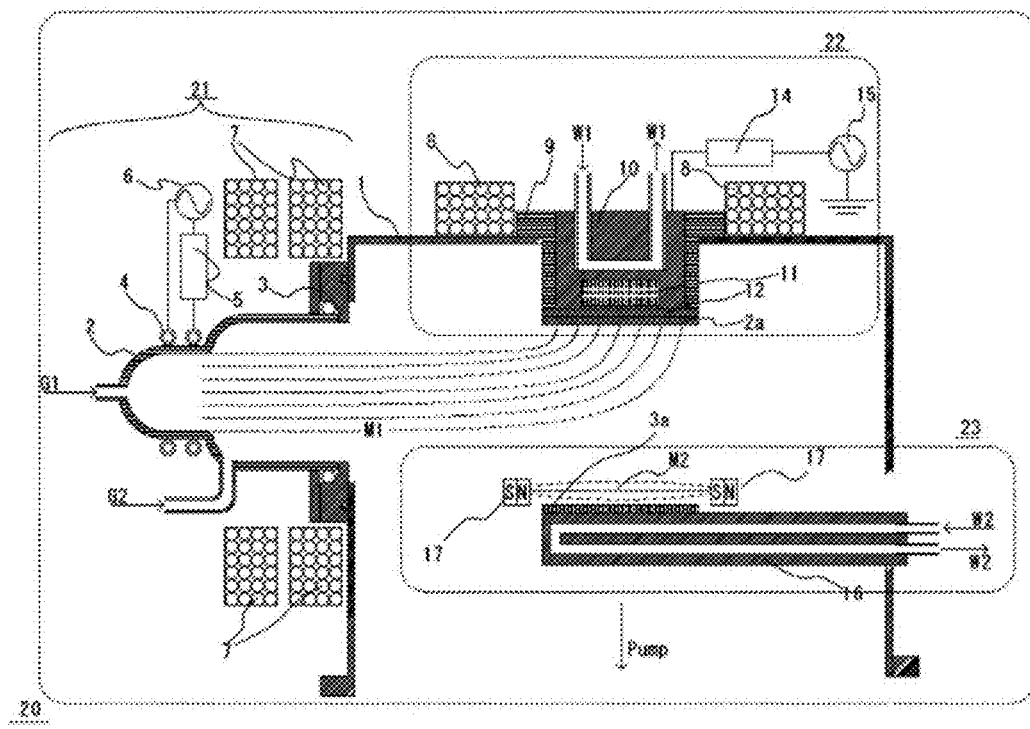
FIG. 2 is a schematic view showing a plasma sputtering device according to one embodiment of the present invention.

As shown in FIG. 2, a plasma sputtering device (20) according to one embodiment of the present invention includes a vacuum chamber (1), a vacuum evacuation pump (Pump), a plasma generating device (21), a target mechanism (22) including a second electromagnet (8), and a substrate stage (23).

The vacuum chamber (1) is brought into a high-vacuum state of $10^{-5}$ Pa or lower in advance by the vacuum evacuation pump (Pump). A portion of a gas introduced into the plasma generating device (21) through a gas injection port (G1) or (G2) is ionized in the plasma generating device (21), whereby high density plasma is generated. Since the inner diameter of the insulating tube (2) is expanded and the distances between the magnetic field lines (M1) and the wall increase, the plasma flows into the vacuum chamber (1) with no contact with the inner wall of the insulating tube (2). This plasma flows inside the vacuum chamber (1) along the magnetic field line structure (M1) curved by the electromagnet (8) and a permanent magnet (11), and flows toward a target member (2a). Ions within the plasma are accelerated toward and are attracted into a target which is biased by a high frequency electric power supply (15) and an impedance matching unit (14), whereby the target member is sputtered. A group of sputtered particles deposits on a substrate (3a) disposed to face the target, whereby a thin film is formed on the substrate (3a). After that, the substrate (3a) is transported to the outside of the vacuum chamber (1) by a substrate transportation robot (not shown). Thus, the thin film formation process is completed.

Next, there will be described the plasma generating device (21) according to the present invention, the plasma sputtering device (20), the substrate stage (23) which can suppress damage, the target mechanism (22) which can raise temperature, a plasma sputtering device (24) including a plurality of plasma generating devices (21) connected thereto, and a method of controlling the distribution of ion attraction by the second electromagnet (8).
<Plasma Generating Device>

The plasma generating device (21) used in the present invention is an improvement of a magnetized type ICP (inductively coupled plasma) generating device which generates plasma by high frequency electric power in the MHz band under application of a static magnetic field; i.e., performs electron heating by a so-called induced electromagnetic field, or an improvement of a helicon wave plasma generating device which performs electron heating by interaction between plasma and wave when high-power and high-frequency electric power is applied. The insulating tube (2) (for example, a glass tube or a ceramic tube) which corresponds to a plasma generation region has a structure in which its inner diameter changes in the longitudinal direction. The insulating tube (2) has a gas injection port (G1, G2) located at an upstream end of the insulating tube (2) or located in the side wall of the insulating tube (2). The insulating tube (2) is connected to the vacuum chamber (1) via a vacuum flange (3) through use of an o-ring seal or a high-vacuum adhesive seal. After the insulating tube (2) and the vacuum chamber (1) are evacuated, a gas is introduced from the gas injection port G1 or G2 through a mass flow controller, and the internal pressure is maintained at a designated value within the range of 0.01 to 10 Pa. One or a plurality of electromagnets (7) is located in a region where the insulating tube (2) has an increased inner diameter. DC current is supplied to the electromagnet(s) (7) so as to form lines of magnetic force (M1) in which lines of magnetic force passing through the wall surface in the region where the insulating tube (2) has a small inner diameter do not intersect with the wall surface in the region where the insulating tube (2) has an increased inner diameter. In the region where the insulating tube (2) has a small inner diameter, a high frequency antenna (4) which can be water-cooled is wound around the insulating tube (2). High frequency electric power is supplied to the high frequency antenna (4) by using a high frequency electric power supply (6) (for example, 13.56 MHz) and an impedance matching circuit (5) including variable capacitors. Alternatively, high frequency electric power is supplied to the high frequency antenna (4) by using a wide-band high frequency amplifier (6) which can change the frequency of the electric power within the range of, for example, 2 to 100 MHz and a matching circuit composed of fixed capacitors (5). As a result, plasma is generated. The plasma generated in the insulating tube (2) flows to a downstream region along the magnetic field lines (M1). Since the insulating tube (2) has an expanding inner diameter, the magnetic field lines do not intersect with the inner wall of the insulating tube, whereby loss of plasma to the wall surface is suppressed. As a result, high density plasma of $10^{17}$ to $10^{19}$ m$^{-3}$ can be obtained in the downstream region.

<Plasma Sputtering Device>

In the plasma sputtering device (20) according to the present invention, the magnetic field lines generated from the plasma generating device (21) are curved through use of the electromagnet (8) or the permanent magnet (11) so that the high density plasma generated by the plasma generating device (21) effectively flows to the target surface and sputtering is performed as a result of attraction of ions. A target holder (10) having a water-cooling mechanism (W1) and the permanent magnet (11) incorporated therein is disposed, via an insulating flange (9) on a wall surface of the vacuum chamber (1), which wall surface extends in a direction perpendicular to the plasma generating device (21). In the case where the target member (2a) is cooled, the target member (2a) is disposed directly on the target holder (10). High frequency voltage is applied to the target holder (10) by using a high frequency electric power supply (15) (for example, 13.56 MHz) and an impedance matching circuit (14) including a variable capacitors. Alternatively, high frequency voltage is applied to the target holder (10) by using a wide-band high frequency amplifier (15) which can change the frequency of the electric power within the range of, for example, 400 kHz to 100 MHz and a matching circuit composed of fixed capacitors (14). Alternatively, in the case where the target member (2a) is formed of an electrically conductive material and is electrically in contact with the target holder (10), a DC voltage (not shown) is applied. As a result, the ions contained in the plasma flowing from the plasma generating device (21) are attracted and taken into the target member (2a), and the target member (2a) is sputtered as a result of ion bombardment. A substrate stage (23) into which cooling water (W2) is introduced is disposed to face the target mechanism. Particles sputtered from the target member deposit on the substrate (3a), whereby a thin film is formed on the substrate (3a). The substrate (3a) is positioned in a region through which the magnetic field lines extending from the plasma generating device (21) and curved toward the target mechanism (22) do not pass. Alternatively, the substrate (3a) is positioned in a region which is more remote from the target as compared with the above-mentioned region. Thus, the plasma is prevented from flowing into the substrate (3a), whereby ion damage can be mitigated, and formation of high quality crystalline thin film can be realized.

The difference in operation characteristics between the sputtering scheme of the present invention and the commonly used magnetron sputtering scheme will be described with reference to FIGS. 3A-3D for the case where a magnetic material is used as the target member.

In the common magnetron sputtering scheme, as shown in FIG. 3A, the confinement of plasma is improved by leakage magnetic flux to the target surface from a permanent magnet group disposed on the back side of the target, whereby the plasma is maintained, and sputtering is realized. Accordingly, in the case where the target material is a magnetic material, a magnetic circuit is formed as shown in FIG. 3B. Therefore, the leakage flux decreases, and maintenance of the plasma is difficult.

Figure 1:
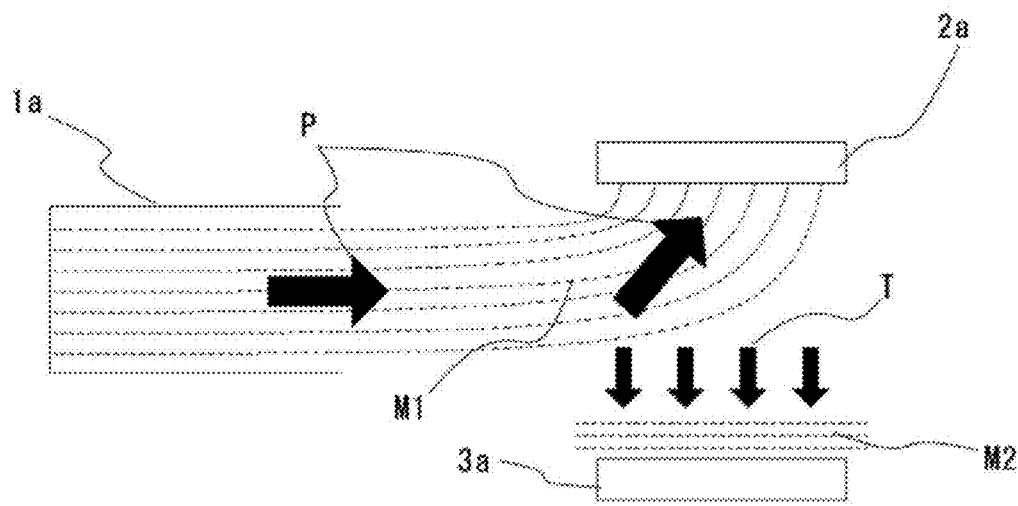
FIG. 1 is an illustration showing the principle of a plasma sputtering device of the present invention.

Meanwhile, in the scheme of the present invention, in the case where a non-magnetic target is used, lines of magnetic force as shown in FIG. 3C are formed. In the case where a magnetic target is used as well, since no closed magnetic circuit is formed, as shown in FIG. 3D, the shape of the magnetic field is approximately the same as in the case of FIG. 3C. Further, since the plasma density can be adjusted by a separately disposed plasma generation source (21), efficient sputtering of a magnetic material is possible. Accordingly, even when the target member (2a) in FIG. 1 is formed of a ferromagnetic material such as copper (Cu) iron (Fe), aluminum (Al) cobalt (Co), or nickel (Ni), the target member (2a) can be sputtered in the same manner. Also, the target member (2a) may be formed of any metal, and inorganic ceramic materials, insulating materials, and semiconductor materials can be used.

<Substrate Stage Mechanism>

Even in the case where shape control is performed by the curved magnetic field (M1), when neutral particles and ions and electrons within plasma collide, a small amount of plasma may flow into the substrate due to diffusion process of plasma crossing the of magnetic field lines. In order to further suppress the ion damage to the substrate (3a), a permanent magnet members (group) (17) is disposed around the substrate stage (16) so as to form magnetic field lines (M2) along the surface of the substrate (3a). It has been known that, in the case where plasma diffuses across the magnetic field lines perpendicular to the flow of plasma, electron temperature lowers. When the magnitude of the magnetic field is increased, the electron temperature lowering effect becomes remarkable (see Patent Document 3, etc.). The voltage drop Vsh by the sheath structure on the surface of the substrate is represented by the following expression.

$$Vsh = T_e \ln(M/2 \cdot m_e)$$ [Mathematical Expression 1]

In the expression, $T_e$, M, and $m_e$ represent electron temperature, ion mass, and electron mass, respectively.

Accordingly, since the sheath voltage drop Vsh decreases as the electron temperature $T_e$ lowers, the ion energy flowing into the substrate can be reduced. As a result, ion damage can be suppressed. Meanwhile, the main component of particles sputtered from the target member (2a) is electrically neutral and contributes to formation of a thin film without being affected by the magnetic field lines force (M2) produced by the permanent magnet members (group) (17). Also, even in the case where the particles sputtered from the target member (2a) are ionized, since ions are large in mass and unlikely to be affected by the magnetic field lines, the particles do not receive the influence of the lines of magnetic force (M2). Further, since the voltage drop Vsh is suppressed, the particles deposit on the substrate in a low energy state, thereby contributing formation of thin film.

Also, as described above, the substrate is positioned in a region through which the magnetic field lines extending from the plasma generating device (21) and curved toward the target mechanism (22) do not pass, or a region which is more remote from the target. Therefore, it is possible to prevent ions from the plasma generating device (21) and high-energy particles generated from the target surface from flowing into the substrate. This contributes to formation of a thin film while suppressing plasma damage.

<Temperature Raiseable Target Mechanism>

As described above, in the target mechanism (22), the permanent magnet (11) is incorporated into the target holder (10). Therefore, the cooling mechanism (W1) is indispensable for maintaining stable permanent magnet characteristics. As shown in FIG. 1, a heat insulating plate (12) formed of ceramic or the like is inserted between the target member (2a) and the target holder (10). This structure allows raising the temperature of the target only. The energy (Et) absorbed by the target approximately corresponds to the energy of ions taken into the target. The approximate energy $E_t$ flowing into the target per unit time is calculated by the following expression.

$$Et=0.61*n*u_B*S*e*Ei \qquad \text{[Mathematical Expression 2]}$$

In this expression, n represents the density of plasma, $u_B$ represents the Bohm speed $(eTe/M_{Ar})^{1/2}$, S represents the area of the target, e represents elementary charge, and Ei represents the energy of argonions taken into the target.

For example, in a typical case where the plasma density $n=10^{18}$ $m^{-3}$, the electron temperature $T_e=3$ eV, the plasma radius is 5 cm, and the argon ion energy Ei=500 eV, electric power on the order of 1 kW at the maximum can be applied to the surface of the target member, whereby the temperature of the target member (2a) can be raised.

<Large Diameter Target Mechanism>

In the plasma sputtering device as described above, outgas or scattering of impurities from the wall surface of the vacuum chamber (1) caused by the ions flowing into the vacuum chamber (1) greatly affects the crystallinity and quality of the thin film. In order to avoid mixing of particles other than the particles sputtered from the target material by plasma, the target member (2a) preferably has a diameter equal to or larger than the diameter of the plasma generating device (21). Also, it is preferred that pre-sputtering is performed more than enough before film formation so as to coat the wall surface of the vacuum chamber (1) with the target material, thereby mitigating the influence of the mixing of impurities from the wall surface.

<Plasma Sputtering Device Including a Plurality of Plasma Generating Devices (21)>

FIG. 4 is a schematic view of a plasma sputtering device which includes a plurality of plasma generating devices (21) connected to the vacuum chamber (1). The plurality of plasma generating devices (21) are connected to the side wall of the vacuum chamber (1) and are caused to generate plasma independently of one another. Coil current supplied to the second electromagnet (8) and the magnitude of the magnetic field of the permanent magnet (11) are adjusted such that the magnetic field lines from all the plasma generating device are curved toward the target mechanism (22) by the magnetic fields formed by the second electromagnet (8) and the permanent magnet (11), whereby the plasma flowing out of each plasma generating device can flow toward the target member (2a). As a result, development of a new plasma generating device becomes unnecessary, it becomes possible to flexibly cope with various types of processes, and it becomes possible to form a film through use of a target having a large diameter and to form a film on a substrate having a large diameter.

<Method for Controlling the Distribution of Ion Attraction by the Second Electromagnet>

Figure 5:
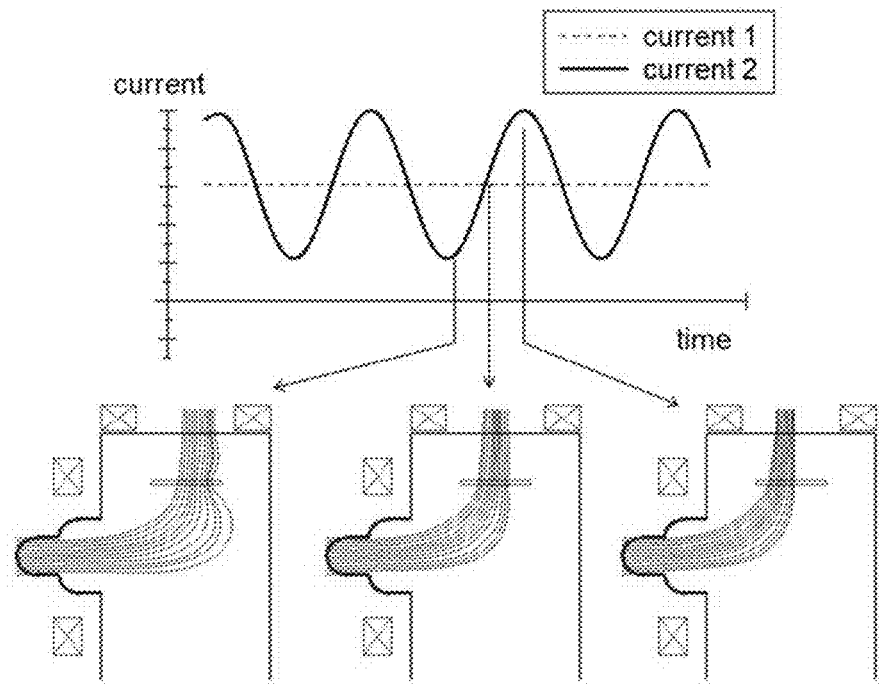
FIG. 5 shows the results of calculation of a magnetic field line structure formed in the plasma sputtering device according to the embodiment of the present invention when excitation current of a second electromagnet (8) is changed at high speed.

FIG. 5 shows the magnetic field line structures at representative times for the case where the current of the first electromagnet (7) contained in the plasma generating device (21) is fixed, and the current of the second electromagnet (8) contained in the target mechanism (22) is changed. The position at which the magnetic field lines (M1) finally converge; i.e., at which the target is irradiated with plasma changes with time. As a result, the time average of the amount of ions taken into the target exhibits a uniform distribution. Therefore, a uniform thin film can be formed.

As described above, the plasma sputtering device of the present invention, the plasma sputtering method of the present invention, and the plasma generating device of the present invention allow formation of film at a high speed of 100 nm/min or higher, preferably 200 nm/min or higher, when the target member is formed of copper (Cu) or aluminum (Al), which are typical metal materials. Also, in the present invention, when the power of the high frequency electric power supply for film formation is increased, film can be formed at a high speed of 500 nm/min or higher, preferably 1 μm/min or higher.

Also, the plasma sputtering device of the present invention, the plasma sputtering method of the present invention, and the plasma generating device of the present invention allow formation of film in a state in which ion damage is suppressed. Therefore, crystalline thin films of compound semiconductor materials such as nitride and oxide can be formed, or crystalline thin films of various types of ferromagnetic materials can be formed.

In the below, the present invention will be described in more detail by means of examples; however, the present invention is not limited to the examples.

Example 1

Figure 6:
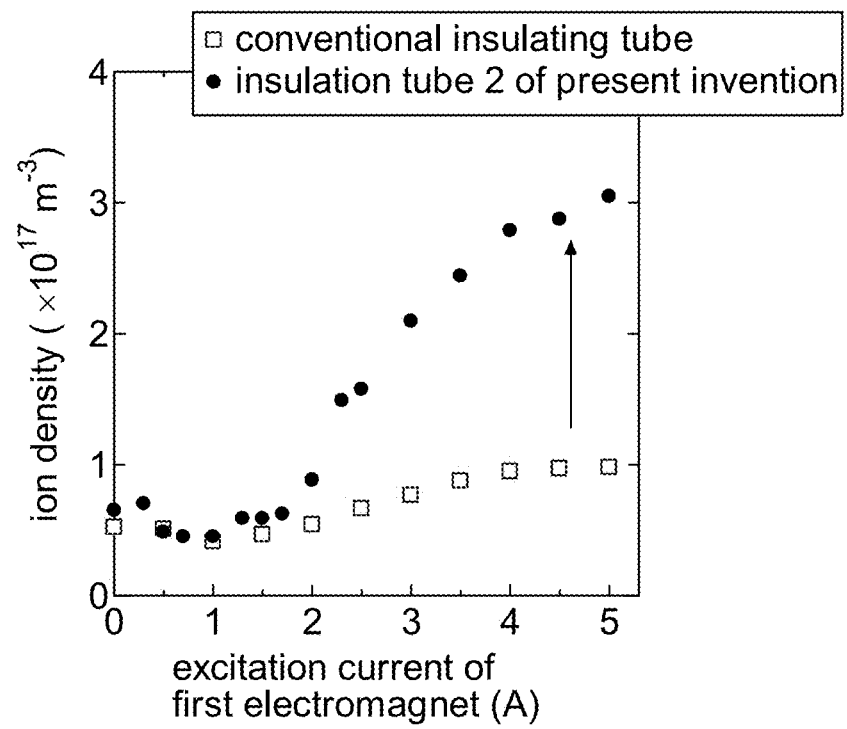
FIG. 6 shows the results of measurement of dependency of plasma density on the excitation current of a first electromagnet (7) for the case where a plasma generating device having a fixed inner diameter was used and the case where the plasma generating device of the present invention having an expanding inner diameter was used, wherein the plasma density was measured at a position 6 cm downstream of the plasma generating device.

This example relates to the plasma generating device (21) according to the embodiment of the present invention. FIG. 6 is a graph showing the dependency of the density of plasma on the excitation current of the first electromagnet (7); i.e., the intensity of the magnetic field, for the case where the insulating tube (2) having an expanding inner diameter was used and the case where an insulating tube having a fixed inner diameter as in the conventional plasma generating device was used. Plasma was generated through use of the frequency variable high frequency electric power supply (6) and the matching circuit (5) composed of fixed capacitors. The density of plasma was measured at a position about 6 cm away from the open exit of the plasma generating device. In this example, the second electromagnet (8) for the curved magnetic field in the downstream region and the permanent magnet (11) of the target mechanism were not used. Therefore, the lines of magnetic force dispersed within the vacuum chamber (1), and the effect of the insulating tube (2) was shown. Notably, argon (Ar) was used as a gas for generating plasma.

When the excitation current was equal to or smaller than 2 A, no clear difference was observed between the case where the conventional insulating tube having a fixed inner diameter was used (white rectangular marks) and the case where the insulating tube (2) of the present invention having an expanding inner diameter was used (black circular marks). It can be seen that, in the case where the insulating tube (2) of the present invention having an expanding inner diameter was used, the plasma density increased greatly in the downstream region when the excitation current of the first electromagnet was equal to or larger than 2 A. Namely, it was found that, in the case the gyro-radius of charged particles forming plasma decreases due to the increased magnetic field intensity and plasma moves along the magnetic field lines, the effect of the insulating tube of the present invention having an expanding inner diameter becomes remarkable. Accordingly, it became clear that, through use of the magnetic field line structure and the insulating tube having an expanding inner diameter, high density plasma can be maintained in the region downstream of the plasma generating device.

Example 2

Figure 7:
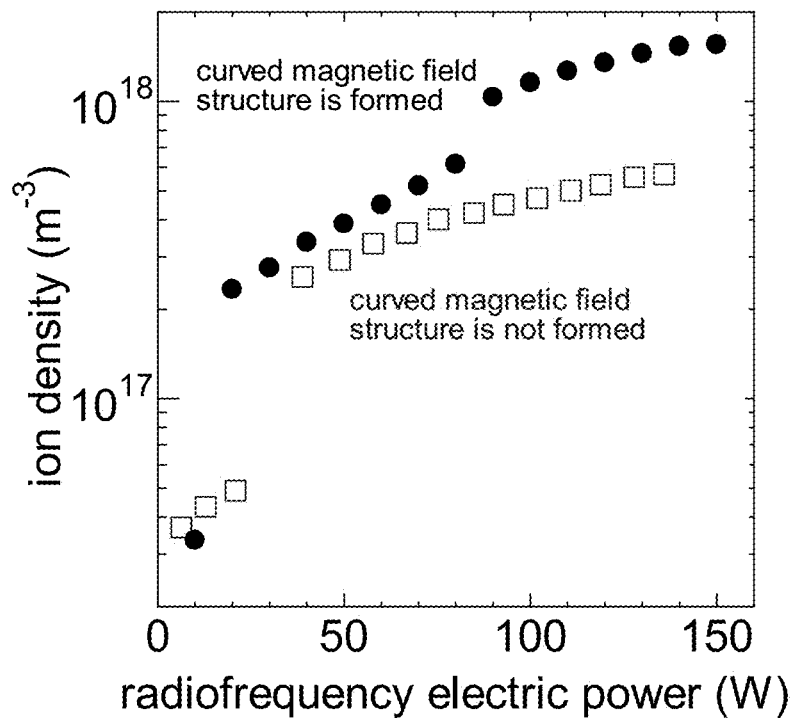
FIG. 7 is a graph showing the dependency of ion density on high frequency electric power supplied to an antenna (4) for the case where a permanent magnet was used for a target holder of the present invention so as to apply a curved magnetic field structure (M1) and the case where the curved magnetic field structure was not applied, wherein the plasma density was measured at a position which is located 6 cm downstream of the plasma generating device and which corresponds to the position of a target.

FIG. 7 is a graph showing the results of measurement of the dependency of the density of plasma on the output power of the high frequency electric power supply (6) in the plasma sputtering device (20) according to the embodiment of the present invention for the case where the plasma generating device (21) according to the present invention was connected to the vacuum chamber (1) and the curved magnetic field structure was not applied and the case where the permanent magnet (11) for curved magnetic field structure was incorporated in the target holder (10) and the curved magnetic field structure was applied. Plasma was generated through use of the frequency variable high frequency electric power supply (6) and the matching circuit (5) composed of fixed capacitors. The density of plasma was measured at a position about 6 cm away from the outlet of the plasma generating device, the position being close to the target position.

It can be seen that the ion density obtained in the case where the curved magnetic field structure is applied (black circular marks) is several times higher than the ion density obtained in the case where the curved magnetic field structure is not applied (white rectangular marks). When the fact that the data were obtained through measurement in the vicinity of the target is taken into consideration, it can be said that the plasma generated by the plasma generating device (21) can be locally fed to the target mechanism (22) by applying the curved magnetic field structure through use of the second electromagnet (8) or the permanent magnet (11).

Example 3

Figure 8:
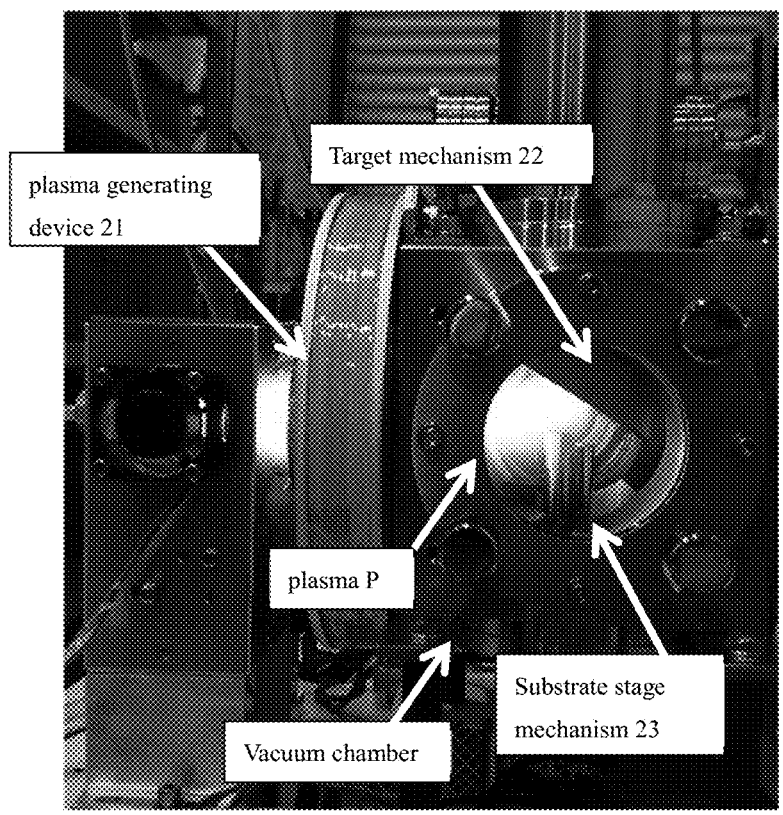
FIG. 8 is a photograph showing the state of discharge when curved magnetic field lines are formed only by a permanent magnet provided in the target holder.

FIG. 8 is a photograph of plasma which was generated in the plasma sputtering device (20) according to the embodiment of the present invention and which was photographed from the view port of the side wall of the vacuum chamber (1). In this example, the plasma generating device (21) of the present invention was connected to the vacuum chamber (1), and the permanent magnet (11) for curved magnetic field structure was incorporated in the target holder (10) so as to form the curved magnetic field structure. Plasma was generated through use of the frequency variable high frequency electric power supply (6) and the matching circuit (5) composed of fixed capacitors. The plasma generating device (21) is present on the left side of FIG. 8, the target mechanism (22) is disposed on the upper side of FIG. 8, and the substrate holder is disposed on the side opposite to the target mechanism (22).

The plasma (P) generated by the plasma generating device (21) is shown in a central region of FIG. 8. It can be seen from the photograph that the plasma (P) curves within the vacuum chamber (1) because of the curved magnetic field structure. The substrate stage mechanism disposed on the opposite side is not irradiated with the plasma (P). The effect of the curved magnetic field was confirmed from this. This demonstrates that a process of forming film while suppressing ion damage to the substrate is possible.

Notably, an experiment was carried out in order to form a film through use of the plasma sputtering device of the present invention, the plasma sputtering method of the present invention, and the plasma generating device of the present invention. In the experiment, copper (Cu) was used to form the target member (2a). The results of the experiment show that a film can be formed on the substrate (3a) at a high seed of 150 nm/min under the condition that the high frequency electric power of the plasma generating device (21) was 100 W and the target bias was at least −1 kV.

Example 4

Table 1 shows the results of measurement of sputtering rate (deposition rate) of the plasma sputtering device (20) according to the embodiment of the present invention for the case where the high frequency electric power was set to 100 W, the target bias was set to about −500 V, and the target material was changed among copper (Cu), aluminum (Al), nickel (Ni), and iron (Fe). Table 1 shows the sputtering rate together with sputter yield (the number of atoms sputtered by a single ion) which is a value peculiar to the material.

TABLE 1

| Target Material | Sputter yield (atoms/ion) | Sputtering rate (nm/min) |
| --- | --- | --- |
| Cu | 2 | 65 |
| Al | 1 | 22.4 |
| Ni | 0.8 | 15.4 |
| Fe | 1.3 | 41.3 |

The deposition rate which differs among the materials is approximately determined by the sputter yield. The deposition rate in the case where the target material was Fe or Ni (ferromagnetic material) was approximately the same level as the deposition rate in the case where the target material was Cu or Al (nonmagnetic material). Therefore, even in the case where a magnetic material is used for the target, it is possible to generate and maintain plasma and form a film through sputtering as in the case where a nonmagnetic material is used for the target.

Example 5

Figure 9:
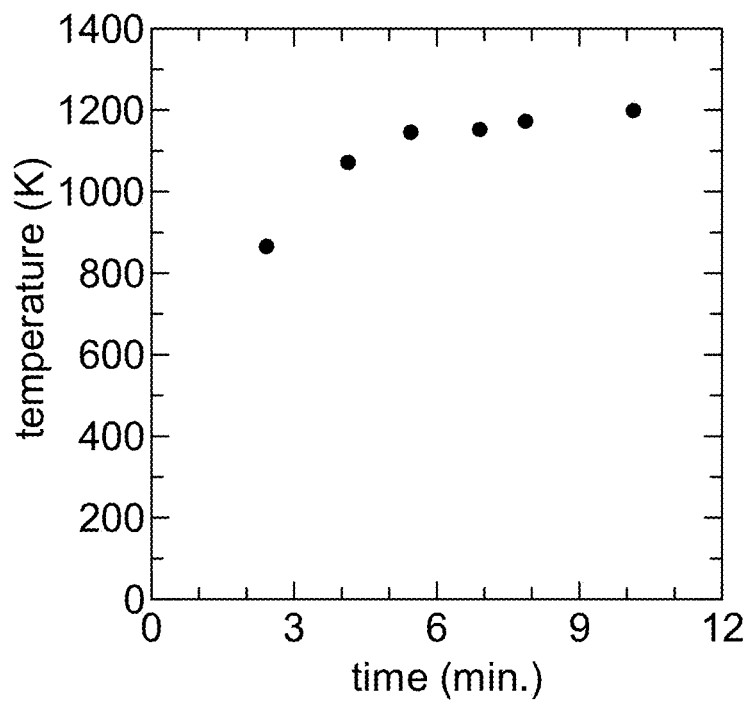
FIG. 9 is a graph showing the results of measurement of the temperature of the surface of the target for the case where the material of the target is NdFeB which is a ferromagnetic material.

FIG. 9 shows the results of measurement of the target temperature in the plasma sputtering device (20) according to the embodiment of the present invention for the case where the target member was formed of NdFeB (ferromagnetic material) and had a thickness of 20 mm, the high frequency electric power was set to 600 W, the target bias was set to about −600 V, and a heat insulating material for temperature raising by ion bombardment was used.

As in the case of Example 3, even when the target is formed of a ferromagnetic material, sputtering by ion bombardment occur as in the case where the target is formed of a nonmagnetic material. Further, use of the heat insulating material makes it possible to raise the temperature of the target material to about 1200 K within several minutes. Notably, as to this temperature raising mechanism, the material is not limited to the ferromagnetic material used in the present example.

Example 6

Figure 10:
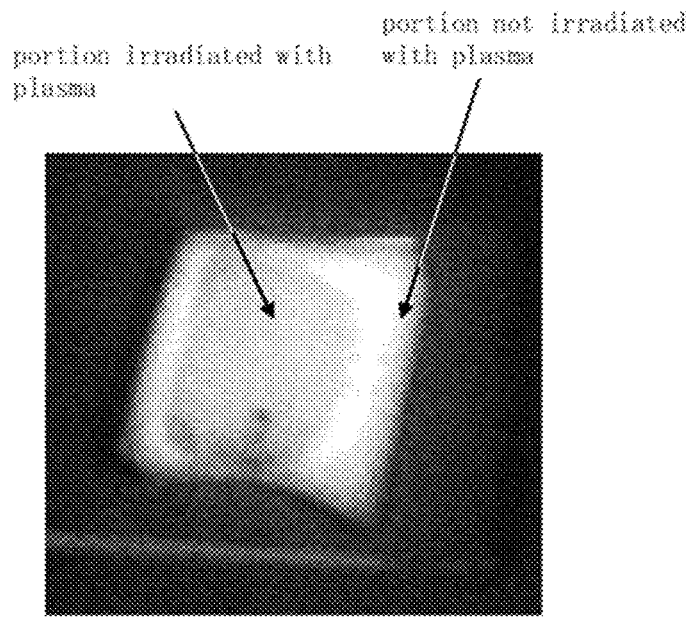
FIG. 10 is a photograph obtained by photographing, after sputtering, the surface of a target which was a GaN film formed on a sapphire substrate and having a thickness of about 100 μm.

FIG. 10 is a photograph of the surface of a target which was a film of GaN (one type of nitride semiconductor)

formed on a sapphire substrate (15 mm×15 mm) and having a thickness of 100 µm and was photographed after sputtering and temperature raising were performed through local ion bombardment.

This photograph suggests that, since the temperature of the surface of a portion irradiated with plasma is raised, in addition to the ion sputtering phenomenon, the sublimation phenomenon occurs in a superimposed manner, so that high-speed film formation is possible. This photograph shows that the material is sputtered at high speed at the portion irradiated with plasma.

Example 7

Figure 11:
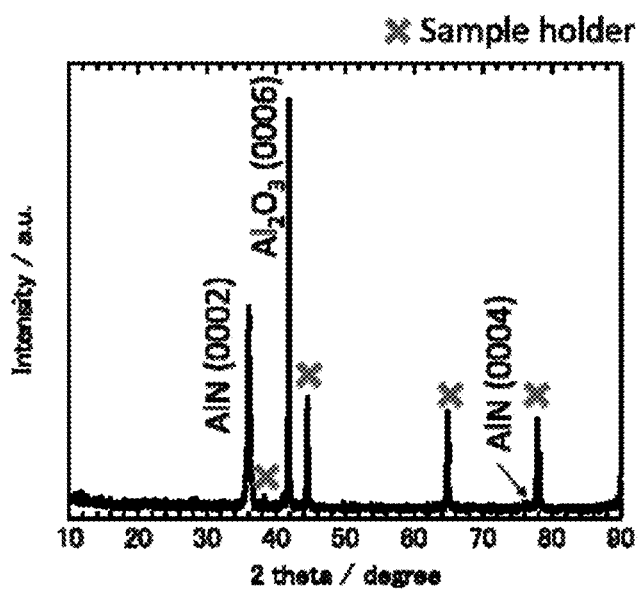
FIG. 11 is a graph showing the results of x-ray diffraction analysis of a sapphire substrate on which a film was formed by the plasma sputtering device (20) of the present invention for the case where a gas mixture of argon and nitrogen was introduced the plasma sputtering device, an aluminum target was used as a target member, and the film was formed on the sapphire substrate through reactive sputtering.

FIG. 11 shows an x-ray diffraction spectrum of a thin film formed on a sapphire substrate in the plasma sputtering device (20) according to the embodiment of the present invention. In this example, the target member was formed of Al and the film was formed by reactive sputtering through use of a gas mixture of argon and nitrogen. Other than peaks originating from the sapphire ($Al_2O_3$) substrate and the sample holders (X marks), only peaks originating from AlN (0002) and AlN (0004) were remarkably observed, which shows that a high quality thin film of aluminum nitride (AlN) can be formed through crystal growth.

Figure 12:
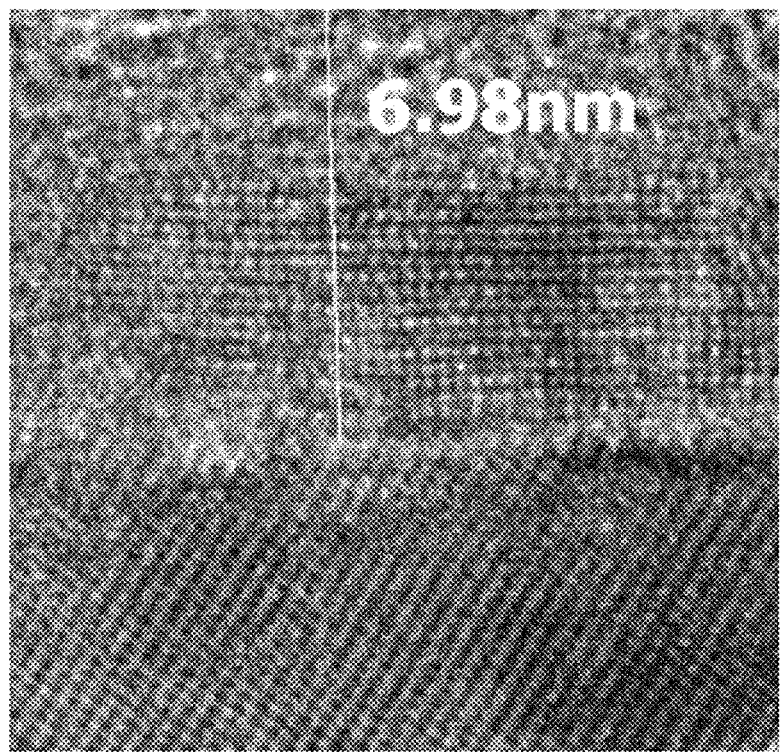
FIG. 12 shows a TEM image of a cross section of the sapphire substrate on which a film was formed by the plasma sputtering device (20) of the present invention for the case where a gas mixture of argon and nitrogen was introduced into the plasma sputtering device, an aluminum target was used as a target member, and the film was formed on the sapphire substrate through reactive sputtering.

Also, FIG. 12 is a cross-sectional TEM image of an AlN film formed by the plasma sputtering device (20) according to the embodiment of the present invention. From this, it was confirmed that AlN crystals are formed on the sapphire substrate.

Figure 13:
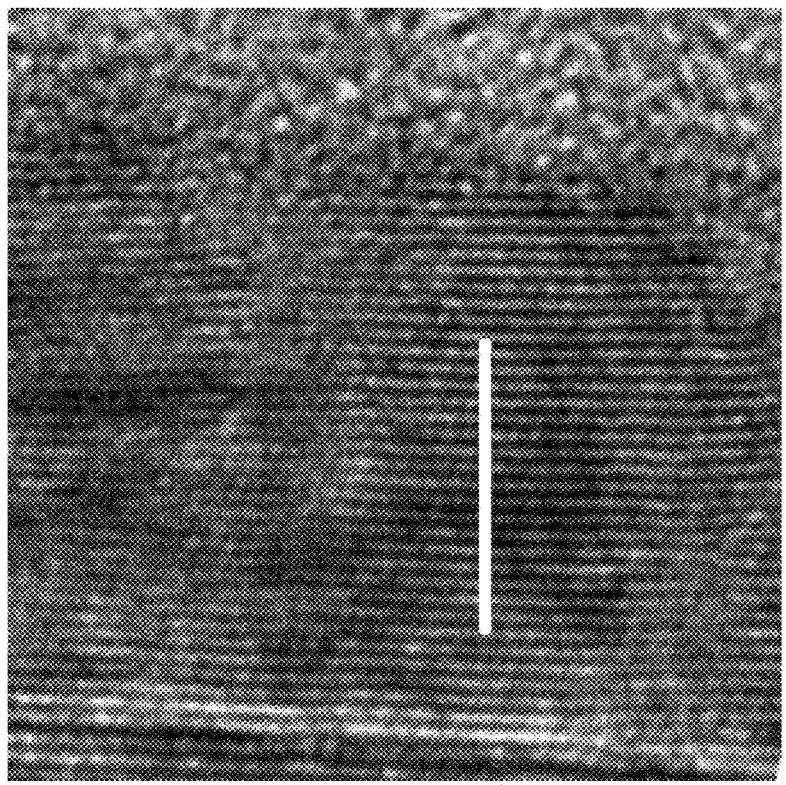
FIG. 13 shows a TEM image of a cross section of a film-formed portion of a GaN substrate on which a film was formed by the plasma sputtering device (20) of the present invention for the case where a pure argon gas was introduced the plasma sputtering device, GaN was used as a target material, and the film was formed on the GaN substrate through reactive sputtering.

FIG. 13 is a cross-sectional TEM image of a layered structure in which a film of gallium nitride (GaN) was formed, through argon sputtering, on a substrate formed as a result of heteroepitaxial growth of an AlN thin film and a GaN thin film on a sapphire substrate. FIG. 13 shows that the crystal of GaN can be grown by the plasma sputtering device (20) according to the embodiment of the present invention.

Example 8

Figure 14:
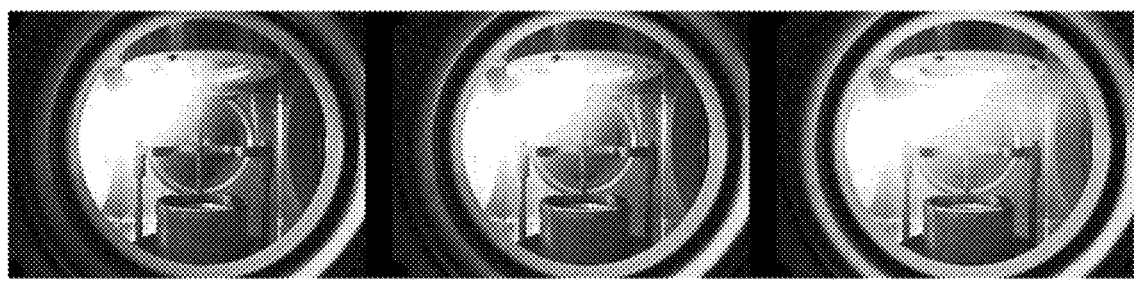
FIG. 14 is a set of photographs each showing the state of plasma optical emission photographed from a view port in a side wall of a vacuum chamber (1) when the current supplied to a second electromagnet (8) was changed in the plasma sputtering method and the plasma sputtering device of the present invention.

FIG. 14 is a photograph of plasma which was generated in the plasma sputtering device (20) according to the embodiment of the present invention and which was photographed from the view port of the side wall of the vacuum chamber (1). In this case, the plasma generating device (21) was connected to the vacuum chamber (1), a curved magnetic field structure was formed by the second electromagnet (8), plasma was generated through use of the high frequency electric power supply (6) (13.56 MHz) and the matching circuit (5) composed of variable capacitors, and the excitation current of the second electromagnet (8) was changed.

It was confirmed that, as described with reference to FIG. 5, the position at which the target member (2a) is irradiated with plasma changes with time by changing the electromagnet excitation current. Therefore, a uniform film can be formed by sputtering.

Example 9

Figure 15:
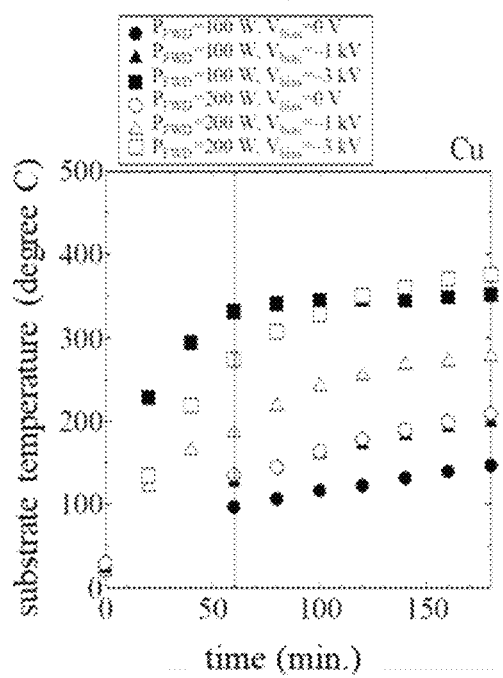
FIG. 15 is a pair of graphs each showing the results of measurement of substrate surface temperature during a sputtering process in the plasma sputtering method and the plasma sputtering device of the present invention for the case where a permanent magnet members (group) (17) for forming a magnetic field structure (M2) on the substrate surface is disposed and the case where the magnetic field structure is not disposed.
Figure 15:
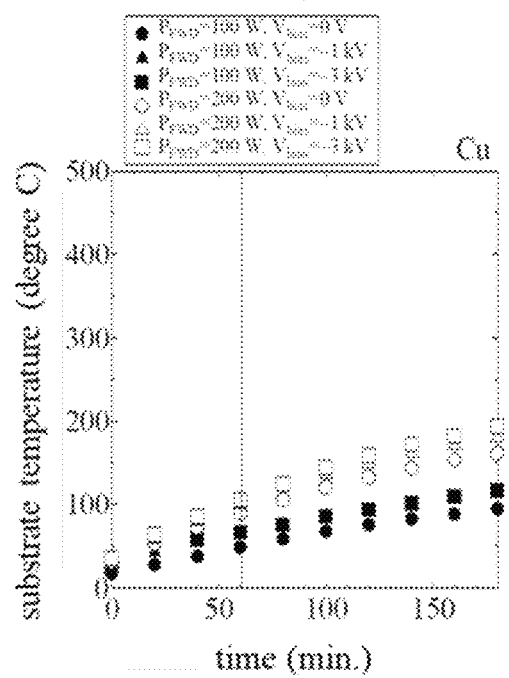

FIG. 15 shows the results of measurement of the surface temperature of the substrate (3a) in the plasma sputtering device (20) according to the embodiment of the present invention. In this example, the target member was formed of Cu, the power of the high frequency electric power supply (6) for plasma generation and the DC voltage applied to the target were changed. The measurement was performed for the case where the permanent magnet group for the magnetic field structure M2 was provided and the case where the permanent magnet group for the magnetic field structure M2 was not provided. As having been already described regarding the substrate stage structure, the ion incident energy to the substrate can be decreased by the magnetic field line structure M2 in the vicinity of the surface of the substrate. Therefore, as shown in FIG. 16, temperature rising of the substrate due to the inflow of ions can be suppressed, and formation of a low damage thin film is possible.

DESCRIPTION OF SYMBOLS

1a: plasma generating device
2a: target member
3a: substrate
M1: curved lines of magnetic force
M2: magnetic field lines on substrate surface
P: arrow indicating the flow of plasma
T: particle scattering from the target
1: vacuum chamber
2: insulating tube
3: connection vacuum flange
4: high frequency antenna
5: matching circuit for the plasma generating device
6: high frequency electric power supply for the plasma generating device
7: first electromagnet
8: second electromagnet
9: insulating flange
10: target holder
11: permanent magnet member for curved magnetic field
12: heat insulating mechanism
14: matching circuit for target bias
15: high frequency electric power supply for target bias
16: substrate stage
17: permanent magnet members (group) for magnetic field structure M2
20: plasma sputtering device
21: plasma generating device
22: target mechanism
23: substrate stage mechanism
G1, G2: gas injection port
W1, W2: cooling mechanism
Pump: vacuum evacuation pump

The invention claimed is:

1. A plasma sputtering method characterized in that one or a plurality of plasmas are generated by one or a plurality of plasma generating devices each having an insulating tube having an expanding inner diameter and having a gas injection port formed in an end portion or a side portion of the insulating tube, a first electromagnet or a permanent magnet member group which can apply a static magnetic field, and a high frequency antenna; and the plasma or plasmas are forced to flow into a vacuum chamber and reach a local region near a target by a curved magnetic field line structure formed by a second electromagnet disposed in a downstream region, whereby ions are taken into the target.

2. A plasma sputtering method according to claim 1, wherein the temperature of the target is raised by ion energy which flows into a target member when the ions are taken into the target.

3. A plasma sputtering method according to claim 1, wherein film formation is performed while entry of ion incident energy to a substrate stage facing a target mechanism is suppressed by a magnetic field line structure formed by a permanent magnet disposed near the substrate stage.

4. A plasma sputtering method according to claim 1, wherein a substrate is disposed at a position at which the substrate does not interfere with the magnetic field line extending from the plasma generating device and curved toward the target or a position further away from the target than that position, whereby plasma damage to the substrate is suppressed.

5. A plasma sputtering method according to claim 1, wherein the target has an area equal to or larger than that of the plasma generating device so as to prevent ion irradiation to members other than a target material.

6. A plasma sputtering device characterized by comprising:
   one or a plurality of plasma generating devices each having an insulating tube having an expanding inner diameter and having a gas injection port formed in an end portion or a side portion of the insulating tube, a first electromagnet or a permanent magnet member group which can apply a static magnetic field, and a high frequency antenna;
   a second electromagnet which is disposed in a region downstream of the plasma generating device and which forms a curved magnetic force line structure;
   a target mechanism; and
   a substrate stage facing the target mechanism.

7. A plasma sputtering device according to claim 6, further comprising a permanent magnet which is embedded in the target mechanism and which can apply a DC or high frequency voltage.

8. A plasma sputtering device according to claim 6, wherein the target mechanism includes a cooling mechanism.

9. A plasma sputtering device according to claim 6, further comprising a heat insulating mechanism between a target material and the target mechanism.

10. A plasma sputtering device according to claim 6, further comprising a second permanent magnet member group disposed around the substrate stage.

11. A plasma sputtering device according to claim 6, wherein a substrate is disposed at a position at which the substrate does not interfere with the curved magnetic field line structure formed by the first electromagnet and the second electromagnet or the target mechanism including a permanent magnet embedded therein, or the substrate is disposed at a position further away from the target than that position.

12. A plasma sputtering device according to claim 6, wherein the target has an area equal to or larger than that of the plasma generating device so as to prevent ion irradiation to members other than the target.

13. A plasma sputtering device according to claim 6, wherein the first electromagnet or a first permanent magnet member group can apply a static magnetic field extending in the longitudinal direction of the insulating tube;
   which plasma sputtering device comprising a high frequency electric power supply device whose frequency band is 2 MHz to 100 MHz, and an inductively coupled high frequency antenna is disposed around the insulating tube.

14. A plasma sputtering device according to claim 10, wherein the second permanent magnet member group around the substrate stage is a permanent magnet member group which can apply a static magnetic field extending parallel to a surface of the substrate.

15. A plasma sputtering device according to claim 6, further comprising means for changing excitation current of the second electromagnet as a function of time.

16. A plasma generating device characterized by comprising:
   an insulating tube having an expanding inner diameter and having a gas injection port formed in an end portion or a side portion of the insulating tube;
   a first electromagnet or a first permanent magnet member group which can apply a static magnetic field of the insulating tube;
   a high frequency electric power supply device whose frequency band is 2 MHz to 100 MHz; and
   an inductively coupled high frequency antenna disposed around the insulating tube.

* * * * *